(12) United States Patent
Maeda et al.

(10) Patent No.: US 8,178,198 B2
(45) Date of Patent: May 15, 2012

(54) ADHESIVE SHEET

(75) Inventors: Jun Maeda, Saitama (JP); Masaharu Ito, Saitama (JP); Keiko Kano, Tokyo (JP); Kazuhiro Takahashi, Saitama (JP)

(73) Assignee: Lintec Corporation, Tokyo (JP)

( * ) Notice: Subject to any disclaimer, the term of this patent is extended or adjusted under 35 U.S.C. 154(b) by 0 days.

(21) Appl. No.: 13/073,438

(22) Filed: Mar. 28, 2011

(65) Prior Publication Data

US 2011/0195561 A1 Aug. 11, 2011

Related U.S. Application Data

(63) Continuation of application No. 11/696,357, filed on Apr. 4, 2007, now Pat. No. 7,935,424.

(30) Foreign Application Priority Data

| Apr. 6, 2006 | (JP) | 2006-105012 |
| Feb. 28, 2007 | (JP) | 2007-049282 |
| Feb. 28, 2007 | (JP) | 2007-049575 |
| Feb. 28, 2007 | (JP) | 2007-049711 |
| Feb. 28, 2007 | (JP) | 2007-049739 |

(51) Int. Cl.
*C08F 2/42* (2006.01)
*C08J 3/28* (2006.01)
*B32B 7/12* (2006.01)
*G03F 7/00* (2006.01)

(52) U.S. Cl. ............ 428/343; 428/423.1; 428/345; 428/355 R; 428/355 AC; 428/355 N; 428/411.1; 428/500; 522/90; 522/93; 522/95; 522/96; 522/104; 522/107; 522/109; 522/110; 522/111; 522/112; 522/114; 522/120; 522/121; 522/126; 522/130; 522/150; 522/151; 522/152; 522/153; 523/300; 430/286.1; 430/284.1; 430/287.1; 430/288.1; 430/270.1; 430/281.1

(58) Field of Classification Search ............... 428/423.1, 428/343, 345, 355 R, 355 AC, 355 N, 411.1; 522/90, 93, 95, 104, 107, 109, 110, 111, 522/112, 113, 114, 120, 121, 126, 130, 150, 522/151, 152, 153; 523/300; 430/270.1, 430/281.1, 284.1, 286.1, 287.1, 288.1

See application file for complete search history.

(56) References Cited

U.S. PATENT DOCUMENTS

| 6,465,330 B1 | 10/2002 | Takahashi et al. |
| 7,935,424 B2 | 5/2011 | Maeda et al. |
| 2006/0246279 A1 * | 11/2006 | Urairi et al. .................. 428/345 |
| 2006/0257651 A1 * | 11/2006 | Shintani et al. .......... 428/355 AC |

FOREIGN PATENT DOCUMENTS

| JP | 60-189938 | 9/1985 |
| JP | 5-335411 | 12/1993 |
| JP | 2000-068237 | 3/2000 |

* cited by examiner

*Primary Examiner* — Sanza McClendon
(74) *Attorney, Agent, or Firm* — Greenblum & Bernstein, PLC

(57) ABSTRACT

An adhesive sheet includes a substrate and an energy-ray curable adhesive layer formed on the substrate. The energy-ray curable adhesive layer includes an energy-ray curable acrylic copolymer and a urethane acrylate. The energy-ray curable acrylic copolymer is formed by copolymerizing at least one of either a dialkyl(meth)acrylamide that has an alkyl group with carbon number of not more than 4, a phenol EO modified (meth)acrylate that has an ethylene glycol chain with a phenyl group bonded to the ethylene glycol chain, a (meth)acryloyl morpholine, or a (meth)acrylate that has an aceto-acetoxyl group, in total of 1 to 30 weight percent of all monomers to form the energy-ray curable acrylic copolymer. The energy-ray curable acrylic copolymer further includes a side chain with an unsaturated group.

18 Claims, 1 Drawing Sheet

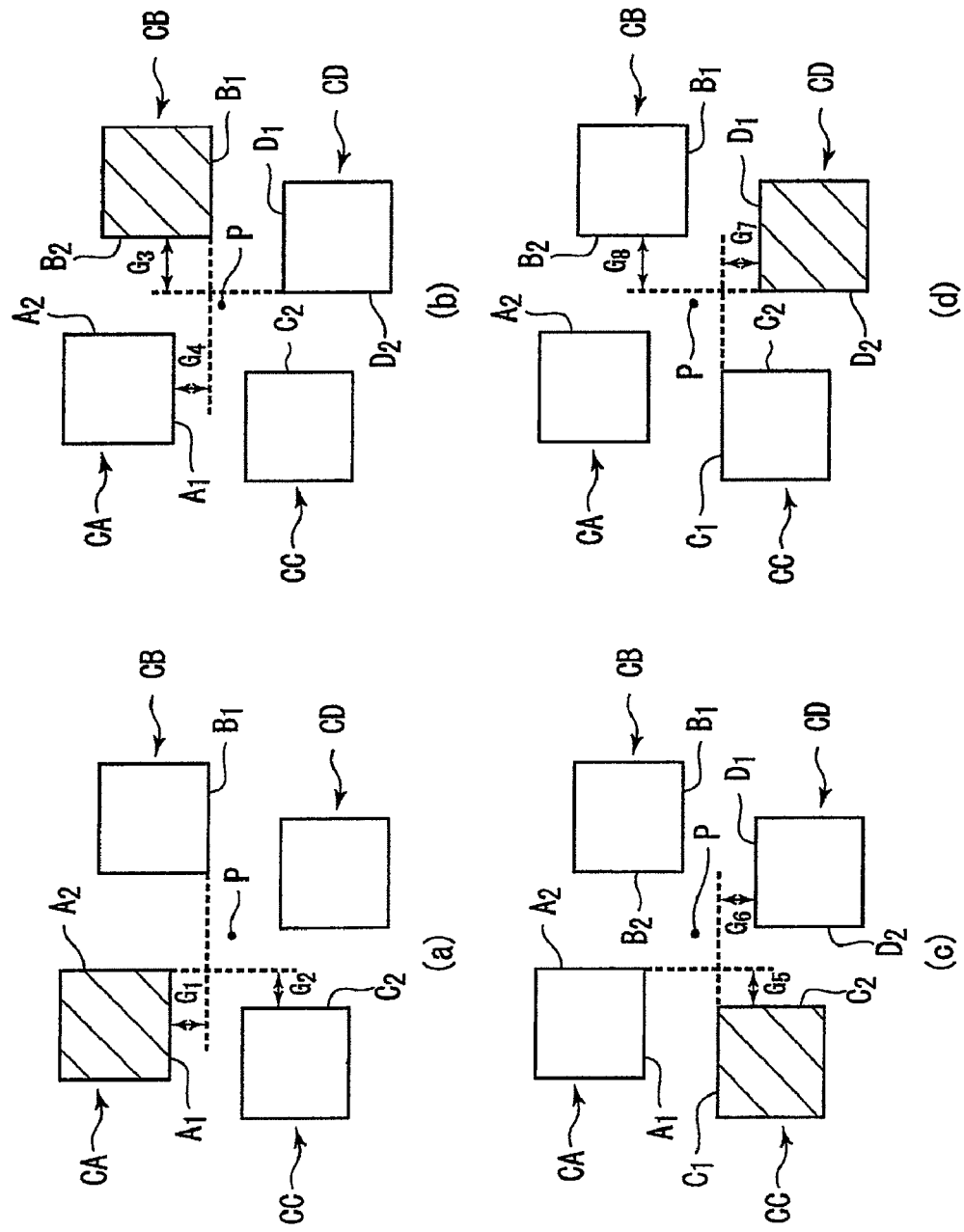

ADHESIVE SHEET

RELATED APPLICATIONS

The present application is a continuation of pending U.S. patent application Ser. No. 11/696,357, filed on Apr. 4, 2007, which claims priority to Japanese Application Nos. 2006-105012, filed Apr. 6, 2006; 2007-049282, filed Feb. 28, 2007; 2007-049575, filed Feb. 28, 2007; 2007-049711, filed Feb. 28, 2007; and 2007-049739, filed Feb. 28, 2007. The disclosure of application Ser. No. 11/696,357 is incorporated by reference herein in its entirety.

BACKGROUND OF THE INVENTION

1. Field of the Invention

The present invention relates to an adhesive sheet, especially to an adhesive sheet which is suitable for protecting a semiconductor circuit when a semiconductor wafer, upon which high density circuit patterns are mounted, is processed.

2. Description of the Related Art

A backside surface of a semiconductor wafer is ground after circuits are formed on a front side surface thereof, so that the thickness of the semiconductor wafer is adjusted. During the grinding process, a protection sheet including an adhesive sheet is adhered to the front side surface to protect the circuits mounted thereon. Such a protection sheet is required not only to prevent damage to the circuits or the wafer body, but also to prevent contamination to the circuit caused by residual adhesive matter following removal, to prevent the penetration of water, for washing off ground waste and cooling tools, onto the circuit surface, and to contribute to the accuracy of the wafer thickness resulting from the grinding process. As such a protection sheet, an adhesive sheet including an ultraviolet ray curable adhesive, is known (Japanese unexamined Patent Publication No. S60-189938).

In regular manufacturing processes, a semiconductor wafer is chipped by a dicing process after a grinding process. Recently, treating a ground wafer has become increasingly difficult in semiconductor manufacturing processes, because the diameter of the wafer has been increasing while the thickness of the wafer has been decreasing, thus the semiconductor wafer is becoming increasingly breakable. Therefore, using a DBG process (that is, dicing before grinding process), where the wafer is partially cut (i.e. the half-cut process) before the grinding process chips the wafer, is promising. In a DBG process, a protection sheet is adhered to the circuit surface of a wafer after undergoing the half cut process (Japanese unexamined Patent Publication No. H05-335411).

In a conventional process, a protection sheet adhered to the circuit surface of a wafer need only prevent penetration of water at the edge of the wafer. On the contrary, in a DBG process, a sufficient adhesion to the surface of each chip of a wafer is required to prevent the penetration of the washing water, because the wafer has already been chipped during the grinding process. When the adhesion of a protection sheet is increased to be firmly adhered to the circuit surface of the wafer, it increases the problem of adhesion residue remaining on the circuit surface after the protection sheet has been stripped away. To solve this problem, an adhesive sheet including an ultraviolet ray curable adhesion has been used as a protection sheet has been used, for example (Japanese unexamined Patent Publication No. 2000-68237).

In one step of the DBG process that differs from a conventional process, following the division of the wafer into a plurality of small chips, the distance separating the individual chips has a tendency to deviate unacceptably (kerf shift) due to the effects of pressurization on each chip during a grinding operation. The breakdown in the alignment of the chips, as explained above, is problematic because the chips may come into contact with each other in the grinding, delivering, or pick-up process.

Because the shapes of semiconductor parts have been changing with respect to the past, relatively uneven elements such as an electrode tend to collect at the periphery of a semiconductor chip, that is, uneven elements tend to be concentrated in a narrow area. Therefore, effectively adhering a protection sheet to the edge of a semiconductor chip is becoming more difficult, so that the protection sheet used in the DBG process may not seal the circuit surface effectively due to poor adhesion to the circuits (followability to bond to the uneven circuit surface). As a result, a problem where water for grinding penetrates the circuit surface has arose. Further, if improving the followability to bond to the uneven circuit surface of the protection sheet, another problem where the cohesion of the adhesive is lowered, so that the kerf shift frequently happens, has arose.

SUMMARY OF THE INVENTION

Therefore, the objective of the present invention is to realize an adhesive sheet, that has sufficient adhesion strength and followability to bond to the uneven circuit surface of a wafer and so on, so that it can prevent the penetration of water used during grinding processes onto the circuit surface of a wafer, prevent a kerf shift, and prevent residual adhesive matter.

An adhesive sheet, according to the present invention, includes a substrate and an energy-ray curable adhesive layer formed on the substrate. The energy-ray curable adhesive layer includes an energy-ray curable acrylic copolymer and a urethane acrylate. The energy-ray curable acrylic copolymer is formed by copolymerizing at least one of either a dialkyl (meth)acrylamide that has an alkyl group with a carbon number of not more than 4, a phenol EO modified (meth)acrylate that has an ethylene glycol chain with a phenyl group bonded to the ethylene glycol chain, a (meth)acryloyl morpholine, or a (meth)acrylate that has an aceto-acetoxyl group, in total of 1 to 30 weight percent of all monomers to form the energy-ray curable acrylic copolymer. The energy-ray curable acrylic copolymer further includes a side chain with an unsaturated group. Note that "EO" stands for ethylene oxide.

BRIEF DESCRIPTION OF THE DRAWING

The present invention will be better understood from the description of the preferred embodiment of the invention set forth below, together with the accompanying drawings in which:

FIG. 1 is a view approximately representing an evaluation method of a kerf shift of an embodiment of the present invention.

DESCRIPTION OF THE PREFERRED EMBODIMENT

Hereinafter, the embodiment of the present invention is explained. An adhesive sheet includes a substrate, and an energy-ray curable adhesive layer formed on the substrate. When the adhesive sheet is used, the energy-ray curable adhesive layer is adhered to a circuit surface of a semiconductor wafer. When the semiconductor wafer is processed by using the DBG process explained below, the backside surface of the semiconductor wafer is ground with the adhesive sheet adhered to the circuit surface thereof. At the time, the adhesive sheet prevents the penetration of the grinding water onto the circuit surface, and prevents the divided chips from coming into contact with each other, thus protecting the semiconductor wafer.

Next, the energy-ray curable adhesive layer is explained. The energy-ray curable adhesive layer includes primarily an energy-ray curable acrylic copolymer and an energy-ray curable urethane acrylate oligomer (urethane acrylate). The energy-ray curable acrylic copolymer includes a reactant of an acrylic copolymer and an unsaturated compound having an unsaturated group, chemically bonded each other. The energy-ray curable adhesive layer further includes components of a crosslinking agent and others, in addition to the energy-ray curable acrylic copolymer and urethane acrylate.

Each component of the energy-ray curable adhesive layer is explained below. The acrylic copolymer is a copolymer of a main monomer, a functional monomer, and at least one of either a dialkyl(meth)acrylamide (N,N-dialkyl(meth)acrylamide), or a phenol EO modified (meth)acrylate, or a (meth)acryloyl morpholine, or a (meth)acrylate that has an aceto-acetoxyl group.

The main monomer provides the fundamental characteristics for the energy-ray curable adhesive layer to function as an adhesive layer. As a main monomer, for example, (meth) acrylic acid ester monomer, or a constitutional unit of the derivatives thereof is used. The (meth)acrylic acid ester monomers that have an alkyl group whose carbon number is 1 to 18, can be used. In these (meth)acrylic acid ester monomers, preferably, methyl acrylate, methyl methacrylate, ethyl acrylate, ethyl methacrylate, propyl acrylate, propyl methacrylate, butyl acrylate, butyl methacrylate, 2-ethyl hexyl acrylate, 2-ethyl hexyl methacrylate, are used. These main monomers are preferably included in 50 to 90 weight percent of all monomers to form the acrylic copolymer.

The acrylic copolymer, for example, includes a dialkyl (meth)acrylamide as a constitutional monomer. The compatibility of the energy-ray curable acrylic copolymer to the urethane acrylate, which has high polarity, is improved by using the dialkyl(meth)acrylamide as a constitutional monomer. The dialkyl(meth)acrylamide used in the present invention may be a dialkylacrylamide or a dialkylmethacrylamide, which have an alkyl group with carbon number of not more than 4. Preferably, a dimethyl(meth)acrylamide or a diethyl (meth)acrylamide is used, with more preference given to the dimethyl(meth)acrylamide.

These dialkyl(meth)acrylamides are preferable because they include an amino group whose reactivity is restrained due to alkyl groups, effectively eliminating negative impact in polymerization and other reactions. Further, the dimethylacrylamide which has the highest polarity in these dialkyl (meth)acrylamide is especially suitable for improving the compatibility of the energy-ray curable acrylic copolymer to the urethane acrylate with high polarity.

Further, for example, the acrylic copolymer includes a phenol EO modified (meth)acrylate as a constitutional monomer. The compatibility of the energy-ray curable acrylic copolymer to the urethane acrylate with high polarity is improved by using the phenol EO modified (meth)acrylate as a constitutional monomer. The phenol EO modified (meth) acrylates used in the present invention may be phenol EO modified acrylamides which have an ethylene glycol chain whose degree of polymerization is not more than 4 and a phenyl group bonded to the ethylene glycol chain, or phenol EO modified methacrylamides which have an ethylene glycol chain whose degree of polymerization is not more than 4 and a phenyl group bonded to the ethylene glycol chain. Preferably, a phenoxyethyl acrylate or a phenoxyethyl methacrylate and so on are used, with more preference given to the phenoxyethyl acrylate. Note that the preferable degree of polymerization is not more than 4.

These phenol EO modified (meth)acrylates are preferred because they do not include a substitution group having high enough reactivity to negatively impact on polymerization and other reactions, and these phenol EO modified (meth)acrylates have a high polarity. The phenoxyethyl acrylate having the highest polarity out of these phenol EO modified (meth) acrylates is especially well suited for improving the compatibility of the energy-ray curable acrylic copolymer to the urethane acrylate with high polarity.

Further, for example, the acrylic copolymer includes a (meth)acryloyl morpholine as a constitutional monomer. The compatibility of the energy-ray curable acrylic copolymer to the urethane acrylate with high polarity is improved by using the (meth)acryloyl morpholine as a constitutional monomer. The (meth)acryloyl morpholines used in the present invention may be a methacryloyl morpholine or an acryloyl morpholine, and preferably an acryloyl morpholine.

The (meth)acryloyl morpholines are preferred because they include an amino group whose reactivity is restrained due to alkyl groups, effectively eliminating the negative impact on polymerization and other reactions. Further, the acryloyl morpholine which has the higher polarity of these (meth)acryloyl morpholines is especially suitable for improving the compatibility of the energy-ray curable acrylic copolymer to the urethane acrylate with high polarity. Note that derivatives of the (meth)acryloyl morpholines, such as one with a heterocycle, one with a substitution group including β alkyl group or other functional groups, or one with a substitution group including functional groups other than a methyl group, can also be used.

Further, for example, the acrylic copolymer includes a (meth)acrylate that has an aceto-acetoxyl group as a constitutional monomer. The compatibility of the energy-ray curable acrylic copolymer to the urethane acrylate with high polarity is improved by using the (meth)acrylate having an aceto-acetoxyl group as a constitutional monomer. The (meth)acrylate having an aceto-acetoxyl group used in the present invention may be 2-aceto-acetoxyl alkyl acrylate or 2-aceto-acetoxyl alkyl methacrylates, preferably 2-aceto-acetoxyl ethyl acrylates, 2-aceto-acetoxyl ethyl methacrylate, 2-aceto-acetoxyl methyl acrylate, 2-aceto-acetoxyl methyl methacrylate, or so on.

These (meth)acrylates are preferable because they have an aceto-acetoxyl group with high polarity, so that they are especially well-suited for improving the compatibility of the energy-ray curable acrylic copolymer to the urethane acrylate with high polarity.

The dialkyl(meth)acrylamide, the phenol EO modified (meth)acrylate, the (meth)acryloyl morpholines, or the (meth)acrylate having an aceto-acetoxyl group, are preferably included in total of 1 to 30 weight percent of all monomers to form the acrylic copolymer, as a constitutional monomer.

The functional monomer is used to make the unsaturated compound bondable to the acrylic copolymer and to provide a functional group which is required, as explained below, for a reaction with a crosslinking agent. That is, a monomer which intramolecularly consists of a polymerizing double bond and a functional group such as a hydroxyl group, a carboxyl group, an amino group, a substituted amino group, or an epoxy group. Preferably, a compound with a hydroxyl group, a carboxyl group, or the like is used.

More specific examples of the functional monomer are; (meth)acrylates with a hydroxyl group, such as 2-hydroxyethyl acrylate, 2-hydroxyethyl methacrylate, 2-hydroxypropyl acrylate, and 2-hydroxypropyl methacrylate; compounds with a carboxyl group, such as an acrylic acid, a methacrylic acid, and an itaconic acid; (meth)acrylate with an amino group, such as N-(2-aminoethyl) acrylamide, and N-(2-aminoethyl)methacrylamide; (meth)acrylates with a substituted amino group, such as monomethyl aminoethyl acrylate and monomethyl aminoethyl methacrylate; (meth)acrylates with an epoxy group, such as a glycidyl acrylate, and a glycidyl acrylate. These functional monomers are preferably included in 1 to 30 weight percent of all monomers to form the acrylic copolymer, as a constitutional monomer.

The acrylic copolymer is formed by a known method for copolymering the monomers above explained, that is, the main monomer, the functional monomer, and at least one of either the dialkyl(meth)acrylamide, the phenol EO modified (meth)acrylate, the (meth)acryloyl morpholine, or the (meth) acrylate that has an aceto-acetoxyl group. However, monomers other than these may be included in the acrylic copolymer. For example, a vinyl formate, a vinyl acetate, or a styrene may be copolymerized and included in the acrylic copolymer in the ratio of approximately or below 10 weight percent.

Next, the unsaturated compound is explained. The unsaturated compound is used to provide an energy-ray curing property to the energy-ray curable acrylic copolymer. That is, the energy-ray curable acrylic copolymer obtains the energy-ray curing property, due to the addition of the unsaturated compound that is polymerized by radiation of ultraviolet ray and other energy-ray. The energy-ray curable acrylic copolymer is formed by the reaction of the acrylic copolymer which contains functional groups and is formed as explained above, and the unsaturated compound which has substituted groups being reactive to the functional groups of the acrylic copolymer.

The substituted group of the unsaturated compound is selected according to the type of functional group of the acrylic copolymer, that is, according to the type of functional group of the monomers used for forming the acrylic copolymer. For example, when the functional group of the acrylic copolymer is a hydroxyl group or a carboxyl group, the substituted group preferably is an isocyanate group or an epoxy group; when the functional group is an amino group or a substituted amino group, the substituted group preferably is an isocyanate group; and when the functional group is an epoxy group, the substituted group preferably is a carboxyl group. Such a substituted group is provided in each molecule of the unsaturated compound.

The unsaturated compound includes approximately 1 to 5 double bonds for polymerization, preferably one or two double bonds in one molecule. The examples of such unsaturated compounds are methacryloyl oxyethyl isocyanate, meta-isopropenyl-α,α-dimethylbenzyl isocyanate, methacryloyl isocyanate, allyl isocyanate, glycidyl (meth)acrylate, (meth)acrylic acid, or so on.

The unsaturated compound is reacted with 100 equivalents of the acrylic copolymer in the ratio of approximately 20 to 100 equivalents, preferably 40 to 90 equivalents, and ideally approximately 50 to 80 equivalents of the unsaturated compound to 100 equivalents of the functional group of the acrylic copolymer to cause a reaction. The reaction of the acrylic copolymer and the unsaturated compound is carried out under conventional conditions, such as the condition where a catalyst in ethyl acetate is used as a solvent and stirred for 24 hours at room temperature under atmospheric pressure.

As a result, the functional groups in the side chains of the acrylic copolymer react with the substituted groups in the unsaturated compound, thus generating the energy-ray curable acrylic copolymer in which unsaturated groups have been introduced to the side chains of the acrylic copolymer therein. The reaction rate of the functional groups and the substituted groups in the reaction is more than 70 percent, preferably more than 80 percent, and a portion of unreacted unsaturated compounds may remain in the energy-ray curable acrylic copolymer. The average molecular weight of the energy-ray curable acrylic copolymer formed from the reaction explained above is preferably more than 100,000, and ideally 200,000 to 2,000,000, with the glass transition temperature thereof preferably in the range of −70 to 10 degrees Celsius.

The urethane acrylate that is mixed with the energy-ray curable acrylic copolymer is an oligomer that includes a diisocyanate molecule, a urethane bond in the constitutional unit, and a (meth)acryloyl group at the terminal thereof. Various oligomers can be used as the urethane acrylate. For example, an oligomer that is obtained from reacting a urethane oligomer which has functional groups at the terminal thereof, with a compound which has a (meth)acryloyl group, can be used as the urethane acrylate. In this formulation, the urethane oligomer is generated in advance by reactions between diisocyanate molecules and diol molecules such as alkylene diols or polyether compounds, or the like with hydroxyl groups at the terminals thereof. Another oligomer, which is formed by reactions of polyether compounds or polyester compounds, both having hydroxyl groups at the terminals thereof, with compounds having a (meth)acryloyl group and an isocyanate group, can be used as the urethane acrylate. Such urethane acrylate oligomers have energy-curing properties due to the action of the (meth)acryloyl groups.

The urethane acrylate is mixed with 100 weight parts of energy-ray curable acrylic copolymer, preferably in the ratio of 1 to 200 weight parts of urethane acrylate, and ideally 5 to 150 weight parts thereof, with 100 weight parts of energy-ray curable acrylic copolymer. The molecular weight of the urethane acrylate molecule is preferably in the range of 300 to 30,000, and ideally in the range of 1,000 to 15,000, in terms of the compatibility with the energy-ray curable acrylic copolymer and the processing properties of the energy-ray curable adhesive layer.

The energy-ray curable adhesive layer of the present invention may include a crosslinking agent. When the energy-ray curable adhesive layer is partially cross-linked by the crosslinking agent, the energy-ray curable adhesive layer becomes resistant to the force applied to itself. Therefore, when the adhesive sheet of the present invention is used in the DBG process, chips are not easily shifted by the shearing force applied by the grindstone in the grinding process, the kerf shift is prevented, and the breakage of chips caused by the edge-to-edge contact with one another is also prevented.

Note that the energy-ray curable adhesive layer of the present invention has a low enough storage modulus to follow the largely uneven circuit surface of a wafer, as explained below. In general, in such an energy-ray curable adhesive layer having low storage elastic modulus, the kerf shift can not be sufficiently prevented despite of the addition of the crosslinking agent. However, the cohesion of the energy-ray curable adhesive layer of the present invention is improved by copolymerization of either the high polar dialkyl(meth)acrylamide, the phenol EO modified (meth)acrylate, the (meth) acryloyl morpholine, or the (meth)acrylate that has an aceto-acetoxyl group. Therefore, the energy-ray curable adhesive layer has excellent followability to bond to an uneven circuit surface and prevent the kerf shift of chips.

The selection of the crosslinking agent which can be bonded to the functional group derived from the functional monomer is explained below. For example, when the functional group is one which has an active hydrogen such as a hydroxyl group, a carboxyl group, or an amino group; organic polyisocyanate compounds, organic polyepoxy compounds, organic polyimine compounds, or metal chelate compounds can be selected as the crosslinking agent. More specifically, examples of the organic polyisocyanate compound are aromatic organic polyisocyanate compounds, aliphatic organic polyisocyanate compounds, alicyclic organic polyisocyanate compounds, the trimmers of these polyisocyanate compounds, the terminal isocyanate urethane pre-polymers obtained from these polyisocyanate compounds and polyol compounds, and so on.

More specific examples of the organic polyisocyanate compounds are 2,4-tolylene diisocyanate, 2,6-tolylene diisocyanate, 1,3-xylylene diisocyanate, 1,4-xylene diisocyanate, diphenylmethane 4,4'-diisocyanate, diphenylmethane 2,4'-diisocyanate, 3-methyldiphenylmethane diisocyanate, hexamethylene diisocyanate, isophorone diisocyanate, dicyclohexylmethane 4,4'-diisocyanate, dicyclohexylmethane 2,4'-diisocyanate, lysine isocyanate, and so on.

Further, specific examples of the organic polyepoxy compounds are bisphenol A type epoxy compounds, bisphenol F type epoxy compounds, 1,3-bis(N,N-diglycidyl-aminomethyl)benzene, 1,3-bis(N,N-diglycidyl-aminomethyl)toluene, N,N,N',N'-tetraglycidyl-4,4-diaminophenyl methane, and so on. Further, specific examples of the organic polyimine compounds are N,N'-diphenylmethane-4,4'-bis(1-aziridine carboxamide), trimethylolpropane-tri-(3-aziridinylpropionate, tetramethylolmethane-tri-β-aziridinylpropionate, N,N'-toluene-2,4-bis(1-aziridine carboxamide), triethylenemelamine, and so on. Note that the quantity of the crosslinking agent is preferably in the range of approximately 0.01 to 20 weight parts, and ideally in the range of approximately 0.1 to 10 weight parts, to the 100 weight parts of energy-ray curable acrylic copolymer.

When the ultraviolet ray is used for curing the energy-ray curable acrylic copolymer, a photopolymerization initiator is added to the energy-ray curable adhesive layer to shorten the time of polymerization and reduce the dose of the ultraviolet ray. As the photopolymerization initiator, for example, benzophenone, acetophenone, benzoin, benzoin methyl ether, benzoin ethyl ether, benzoin isopropyl ether, benzoin isobutyl ether, benzoin benzoate, benzoin methyl benzoate, benzoin dimethyl ketal, 2,4-diethylthioxan-thone, α-hydroxy cyclohexyl phenyl keton, benzyl diphenyl sulfide, tetramethyl thiuram monosulfide, azobisisobutyronitrile, benzil, dibenzil, diacetyl, β-chloro anthraquinone, or 2,4,6-trimethylbenzoyl diphenylphosphine oxide are used. Note that the amount of photopolymerization initiator is preferably 0.1 to 10 weight parts, and ideally approximately 0.5 to 5 weight parts, to 100 weight parts of the energy-ray curable acrylic copolymer.

In addition to these agents, additives such as an anti-aging agent, a stabilizer, a plasticizer, a coloring agent, and so on may be formulated in the energy-ray curable adhesive layer to meet various requirements, without any restriction on a ratio thereof not to depart the purpose of the present invention.

The energy-ray curable adhesive layer of the above explained formulation is a mixture of different components which have relatively high molecular weights. Generally, a mixture of compounds having high molecular weights has low compatibility and the physical properties thereof tend to become unstable. Further, when the energy-ray curable adhesive layer as a mixture has low compatibility, residual adhesive material tends to be left on an adherend, even when the energy-ray curable adhesive layer is cured. On the other hand, in the energy-ray curable adhesive layer of the present invention, the energy-ray curable acrylic copolymer has sufficient compatibility with the urethane acrylate and has a stable adhesion property across a wide range of mixing rates, because the energy-ray curable acrylic copolymer is a copolymer of either the dialkyl(meth)acrylamide, the phenol EO modified (meth)acrylate, the (meth)acryloyl morpholine, or the (meth)acrylate with an aceto-acetoxyl group. The compatibility of the energy-ray curable adhesive layer can be evaluated by measuring the haze value, because a mixture having low compatibility is turbid and becomes hazy.

The energy-ray curable adhesive of the present invention can achieve low storage modulus and large value of tan δ due to the above explained formulation and composition. That is, the value of the storage modulus G' at 25 degrees Celsius of the energy-ray curable adhesive layer of the present invention is preferably between 0.04 to 0.11 MPa, and ideally between 0.05 to 0.1 MPa, while the value of the loss tangent (tan δ=loss modulus/storage modulus) at 25 degrees Celsius is preferably greater than or equal to 0.6, and ideally in the range of 0.6 to 3, when the energy-ray curable adhesive layer is not cured by energy-ray.

When the energy-ray curable adhesive layer has the physical property explained above, the adhesive sheet has sufficient followability to bond to the uneven adherend. That is, when the storage modulus is small, the energy-ray curable adhesive layer can be easily transformed to the unevenness of the adherend, even though the force applied to the adhesive sheet is small. Additionally, when the value of the tan δ is large, the power to return the shape of the transformed energy-ray curable adhesive layer to its original shape is poor.

Therefore, when the storage modulus is small and the value of the tan δ is large, the stickiness of the adhesive sheet to the circuit surface of a semiconductor wafer is maintained during the grinding process, thus preventing penetration of water onto the circuit surface of the chip during grinding.

Further, because the dialkyl(meth)acrylamide, the phenol EO modified (meth)acrylate, the (meth)acryloyl morpholine, or the (meth)acrylate with an aceto-acetoxyl group is copolymerized in the energy-ray curable acrylic copolymer, the energy-ray curable adhesive layer has a high degree cohesion. Therefore, when the adhesive sheet of the present invention is used in the DBG process, the occurrence of kerf shift due to the shearing force applied by the grindstone in the grinding process is mitigated, and the breakage of chips due to edge-to-edge contact with each other can be prevented.

The thickness of the energy-ray curable adhesive layer, which is determined according to the required surface protection property for a semiconductor wafer or other adherends, is preferably in the range of 10 to 200 μm, and ideally in the range of 20 to 100 μm.

Next, the substrate is explained. The material for the substrate is not limited; for example, a polyethylene film, a polypropylene film, a polybutylene film, a polybutadiene film, a polymethylpentene film, a polyvinylchloride film, a polyvinylchloride copolymer film, a polyethylene terephthalate film, a polybutylene terephthalate film, a polyurethane film, an ethylene vinylacetate film, an ionomer resin film, an ethylene (meth)acrylic acid copolymer film, a polystyrene film, a polycarbonate film, a fluorocarbon resin film, and other films can be used. Further, crosslinked films or laminated films of these materials can also be used.

Note that the substrate needs to have a transmittance for the wavelength range of the energy-ray in use. Therefore, for example, when an ultraviolet ray is used as an energy-ray, the substrate needs to have a light transmittance, when an electron-beam is used, the substrate does not need to have a light transmittance so that colored substrate may be used. The thickness of the substrate, which is adjusted according to the required properties of the adhesive sheet, is preferably in the range of 20 to 300 μm, and ideally in the range of 50 to 150 μm.

A release film for protecting the energy-ray curable adhesive layer may be laminated onto the adhesive sheet of the present invention. A film of polyethylene terephthalate, polyethylene naphtahalate, polypropyrene, polyethyrene, or so on, may be used as the release film when the surface on one side of which is treated with a release agent of silicone resin and so on. However, the release film is not limited to those described above.

Next, the characteristics of the adhesive sheet are explained. The adhesion strength of the adhesive sheet of the present invention is preferably greater than or equal to 7000 mN/25 mm when the adhesive sheet is not cured by an energy-ray, and is preferably not more than 500 mN/25 mm when the adhesive sheet is cured by an energy-ray. Ideally, the adhesion strength of the adhesive sheet is greater than or equal to 10,000 mN/25 mm before being cured, and between 1.0 to 300 mN/25 mm after being cured. Having such adhesion strength, the adhesive sheet can be tightly sealed to a circuit surface, and the sealing condition can be maintained throughout a grinding process of a semiconductor wafer. Further, such an adhesive sheet can be stripped away without damaging a semiconductor wafer.

Next, the production method for the adhesive sheet of the present invention is explained. First, by mixing the energy-ray curable acrylic copolymer together with the urethane acrylate and required additives such as a crosslinking agent and a photopolymerization initiator, in a suitable solvent property adjusted for concentration and viscosity, a coating liquid to be coated for forming the energy-ray curable adhesive layer is prepared. Then, by applying the coating liquid to a release-treated surface of a release film and drying, the energy-ray curable adhesive layer is formed. Finally, by laminating the exposed surface of the energy-ray curable adhesive layer onto a surface of the substrate, the adhesive sheet of a predetermined thickness is produced. To apply the coating liquid to the release film, a coating device such as a gravure coater, a die coater, a roll coater, a knife coater, a roll knife coater, or a curtain coater may be used. Further, the adhesive sheet may be produced by the following method, i.e., applying the coating liquid directly to the substrate and drying, then adhering a release film thereto.

Next the DBG process is explained. In the DBG process, on a wafer surface where a semiconductor circuit has been formed, a groove of a depth shallower than the thickness of the wafer is formed. Then, the backside surface of the semiconductor wafer is ground so that the thickness of the wafer is reduced before the final step of dividing the wafer into many chips. In such a DBG process, an adhesive sheet is useful as a means for both protecting the wafer surface and temporarily holding the wafer.

Specifically, the adhesive sheet is used in the DBG process including following steps. First, a groove having a predetermined depth is excavated along straight lines for sectioning the circuits on a wafer. Next, an adhesive sheet is adhered to the entire surface of the wafer upon which the grooves have been excavated. At this time, the surface of the wafer is complex and uneven due to electrodes or protection layers installed during the circuit forming process. Nevertheless, the adhesive sheet of the present invention is of sufficiently followability to match the uneven circuit surface, because the energy-ray curable adhesive layer thereof has a low storage modulus, a large value of tan δ, and excellent adhesion when it is not cured. The adhesive sheet of the present invention can maintain followability to follow the uneven wafer surface during the grinding process, due to the properties explained above. Therefore, when the backside surface of the wafer is ground down to a predetermined thickness to remove the bottom of the grooves, and the wafer is divided into a plurality of chips, the adhesive sheet of the present invention can reliably prevent penetration of water onto the circuit surface.

Later on, an energy-ray is irradiated to the adhesive sheet to cure it and decrease its adhesion strength, a mounting sheet is attached to the ground surfaces of the chips, and the adhesive sheet is removed. At this time, the energy-ray curable acrylic copolymer and the urethane acrylate are cured and the adhesion of the adhesive sheet is decreased enough so that the adhesive sheet can be removed without damaging the wafer with residual adhesive matter.

At this point, the chips can be picked up from the mounting sheet. By using the adhesive sheet of the present invention in the DBG process as explained above, chips can be generated at a high yield rate.

The adhesive sheet of the present invention can also be used as a adhesive sheet adhered temporarily to a largely uneven surface, in addition to its suitability for use as a protection sheet in the DBG process of manufacturing semiconductor devices, as explained. For example, the adhesive sheet is also a suitable protection sheet for a semiconductor wafer produced by conventional processes. Further, it is also suitable for temporary adherence to a smooth, even surface of a material.

Table 1 is a formulation table of working examples of energy-ray curable adhesives that use a dialkyl methacrylamide as a constitutional monomer of an acrylic copolymer, and comparative examples.

TABLE 1

| | ENERGY-RAY CURING ACRYL COPOLYMER | | | | | UNSATURATED COMPOUND | | URETHANE ACRYLATE | OTHERS | |
|---|---|---|---|---|---|---|---|---|---|---|
| | ACRYL COPOLYMER (A1) | | | | | | | | C.L. | P.I. |
| | BA | DMAA | MMA | AA | HEA | MOI | | UA | CL | PI |
| WORKING EXAMPLE 1 | 67 | 5 | 0 | 0 | 28 | 8 | (71.3) | 40 | 0.63 | 3.3 |
| WORKING EXAMPLE 2 | 62 | 10 | 0 | 0 | 28 | 8 | (71.3) | 6.7 | 0.63 | 3.3 |
| WORKING EXAMPLE 3 | 62 | 10 | 0 | 0 | 28 | 8 | (71.3) | 13.3 | 0.63 | 3.3 |
| WORKING EXAMPLE 4 | 62 | 10 | 0 | 0 | 28 | 8 | (71.3) | 26.7 | 0.63 | 3.3 |
| WORKING EXAMPLE 5 | 62 | 10 | 0 | 0 | 28 | 8 | (71.3) | 40 | 0.63 | 3.3 |

TABLE 1-continued

| | ENERGY-RAY CURING ACRYL COPOLYMER | | | | | | | | | |
|---|---|---|---|---|---|---|---|---|---|---|
| | ACRYL COPOLYMER (A1) | | | | | UNSATURATED COMPOUND | URETHNANE ACRYLATE | OTHERS | | |
| | | | | | | | | C.L. | P.I. | |
| | BA | DMAA | MMA | AA | HEA | MOI | UA | CL | PI | |
| WORKING EXAMPLE 6 | 62 | 10 | 0 | 0 | 28 | 8 (71.3) | 53.3 | 0.63 | 3.3 | |
| WORKING EXAMPLE 7 | 52 | 20 | 0 | 0 | 28 | 8 (71.3) | 66.7 | 0.63 | 3.3 | |
| WORKING EXAMPLE 8 | 52 | 20 | 0 | 0 | 28 | 8 (71.3) | 40 | 0.63 | 3.3 | |
| COMPARATIVE EXAMPLE 1 | 70 | 0 | 0 | 0 | 30 | 8 (66.5) | 0 | 0.63 | 3.3 | |
| COMPARATIVE EXAMPLE 2 | 62 | 10 | 0 | 0 | 28 | 8 (71.3) | 0 | 0.63 | 3.3 | |
| COMPARATIVE EXAMPLE 3 | 70 | 0 | 0 | 0 | 30 | 8 (66.5) | 40 | 0.63 | 3.3 | |
| COMPARATIVE EXAMPLE 4 | 84 | 0 | 10 | 1 | 5 | 0 | 100 | 0.63 | 3.3 | |
| COMPARATIVE EXAMPLE 5 | 84 | 0 | 10 | 1 | 5 | 0 | 60 | 0.63 | 3.3 | |
| COMPARATIVE EXAMPLE 6 | 84 | 0 | 10 | 1 | 5 | 0 | 20 | 0.63 | 3.3 | |
| | WEIGHT PART | WEIGHT PART | WEIGHT PART | WEIGHT PART | WEIGHT PART | WEIGHT PART / EQUIVALENT RATIO | WEIGHT PART | WEIGHT PART | WEIGHT PART | |

(C.L.: Crosslinking Agent, P.I.: Photomerization Initiator)

The energy-ray curable adhesives of working examples 1 to 8 and comparative examples 1 to 6, are formed as follows.

As main monomers, 67 weight parts of the butyl acrylate (BA) and 5 weight parts of the dimethyl acrylamide (DMAA), as a functional monomer, 28 weight parts of the 2-hydroxyethyl acrylate (HEA), were solution-polymerized in a solvent of ethyl acetate. As a result, the acrylic copolymer (A1) was generated with a weight average molecular weight of 500,000 and glass transition temperature of −10 degrees Celsius.

Then, 100 weight parts of the solid content of the acrylic copolymer, and 8 weight parts of methacryloyl oxyethyl isocyanate (MOI, 71.3 equivalents of MOI per 100 equivalents of the hydroxyl group, which is the functional group of the acrylic copolymer) were mixed together to create a reaction producing the energy-ray curable acrylic copolymer as a solution (30 percent solution) in the ethyl acetate.

To the 100 weight parts of the energy-ray curable acrylic copolymer, 0.625 weight parts (solid content ratio) of the polyisocyanate compound CL (Colonate L, trade name of a product of NIPPON POLYURETHANE INDUSTRY CO., LTD.) as a crosslinking agent, and 3.3 weight parts (solid content ratio) of a photopolymerization initiator PI (IRGACURE 184, trade name of a product of Ciba Specialty Chemicals K.K.) were mixed therein, further, 40 weight parts (solid content ratio) of a dual functional urethane acrylate UA (Shiko UV-3210EA, trade name of a product of The Nippon Synthetic Chemical Industry Co., Ltd., weight average molecular weight of 9,000) was added thereto, thus obtaining the energy-ray curable adhesive of working example 1.

The energy-ray curable adhesive was applied with a roll knife coater, onto the surface of a polyethylene terephthalate film (thickness: 38 μm) serving as a release film with a surface that had been a release-treated with a silicone resin. Further, the energy-ray curable adhesive and the polyethylene terephthalate film were dried for one minute at 100 degrees Celsius to make the thickness of the energy-ray curable adhesive be 40 μm. Later on, the energy-ray curable adhesive was laminated onto a substrate of polyethylene film with a thickness of 110 μm, thus resulting in the energy-ray curable adhesive layer of working example 1 with the formulation represented in Table 1.

Note that the energy-ray curable adhesive layers of working examples 2 to 8 and comparative examples 1 to 3, were obtained by the same method as that of working example 1, other than the differences among formulations as represented in Table 1. The energy-ray curable adhesives of comparative examples 4 to 6 were formed as explained below.

As main monomers, 84 weight parts of the butyl acrylate (BA), 10 weight parts of the methyl methacrylate (MMA), and 1 weight part of the acrylic acid (AA), and as a functional monomer, 5 weight parts of the 2-hydroxyethyl acrylate (HEA) were solution-polymerized in the solvent of ethyl acetate. As a result, the acrylic copolymer (A1) was generated with a weight average molecular weight of 500,000 and glass transition temperature of −10 degrees Celsius.

To the 100 weight parts of the energy-ray curable acrylic copolymer, 0.625 weight parts (solid content ratio) of the polyisocyanate compound CL (Colonate L, trade name of a product of NIPPON POLYURETHANE INDUSTRY CO., LTD.) as a crosslinking agent, and 3.3 weight parts (solid content ratio) of a photopolymerization initiator PI (IRGACURE 184, trade name of a product of Ciba Specialty Chemicals K.K.) were mixed therein, further, 100 weight parts (solid content ratio) of a dual functional urethane acrylate UA (Shiko UV-3210EA, trade name of a product of The Nippon Synthetic Chemical Industry Co., Ltd., weight average molecular weight of 9,000) was added thereto, thus obtaining the energy-ray curable adhesive of comparative example 4.

Similar treatments that were applied to working examples 1 to 8 and comparative examples 1 to 3 were also carried out on behalf of the energy-ray curable adhesive layer of comparative example 4, resulting in the formulation represented in Table 1.

Note that the energy-ray curable adhesive layers of comparative examples 5 and 6 were obtained by the same method as that of comparative example 4, other than the differences among formulations as represented in Table 1.

Table 2 is a formulation table containing both working examples and a comparative example of the energy-ray curable adhesives using a phenol EO modified (meth)acrylate as a constitutional monomer of an acrylic copolymer.

TABLE 2

| | ENERGY-RAY CURING ACRYL COPOLYMER | | | | | | | URETHNANE | OTHERS | |
|---|---|---|---|---|---|---|---|---|---|---|
| | ACRYL COPOLYMER (A1) | | | | | UNSATURATED COMPOUND | | ACRYLATE | C.L. | P.I. |
| | BA | PEA | MMA | AA | HEA | MOI | | UA | CL | PI |
| WORKING EXAMPLE 9 | 65 | 7 | 0 | 0 | 28 | 10 | (90.0) | 30 | 0.63 | 3.3 |
| WORKING EXAMPLE 10 | 65 | 7 | 0 | 0 | 28 | 10 | (90.0) | 60 | 0.63 | 3.3 |
| WORKING EXAMPLE 11 | 70 | 13 | 0 | 0 | 17 | 6 | (83.0) | 30 | 0.63 | 3.3 |
| WORKING EXAMPLE 12 | 70 | 13 | 0 | 0 | 17 | 6 | (83.0) | 60 | 0.63 | 3.3 |
| WORKING EXAMPLE 13 | 52 | 20 | 0 | 0 | 28 | 8 | (71.3) | 30 | 0.63 | 3.3 |
| WORKING EXAMPLE 14 | 52 | 20 | 0 | 0 | 28 | 8 | (71.3) | 60 | 0.63 | 3.3 |
| COMPARATIVE EXAMPLE 7 | 70 | 13 | 0 | 0 | 17 | 6 | (83.0) | 0 | 0.63 | 3.3 |
| | WEIGHT PART | WEIGHT PART | WEIGHT PART | WEIGHT PART | WEIGHT PART | WEIGHT PART | EQUIVALENT RATIO | WEIGHT PART | WEIGHT PART | WEIGHT PART |

(C.L.: Crosslinking Agent, P.I.: Photomerization Initiator)

In the energy-ray curable adhesives of working examples 9 to 14 and comparative example 7 represented in Table 2, phenoxyethyl acrylate (PEA) was used instead of dimethyl acrylamide (DMAA). The adhesive sheets including the energy-ray curable adhesive layers in Table 2 were obtained by the same method as that which produced the adhesive sheets of working examples 1 to 8 and comparative examples 1 to 6 (see Table 1), other than the differences among formulations as represented in Table 2.

Table 3 is a formulation table containing both working examples and a comparative example of the energy-ray curable adhesives using a (meth)acryloyl morpholine as a constitutional monomer of an acrylic copolymer.

In the energy-ray curable adhesives of working examples 15 to 20 and comparative example 8 represented in Table 3, acryloyl morpholine (ACMO) was used instead of DMAA and PEA. The adhesive sheets including the energy-ray curable adhesive layers in Table 3 were obtained by the same method as that which produced the adhesive sheets of working example 1 to 14 and comparative examples 1 to 7 (see Tables 1 and 2), other than the differences among formulations as represented in Table 3.

Table 4 is a formulation table containing both working examples and a comparative example of the energy-ray curable adhesives using a (meth)acrylate with an aceto-acetoxyl group as a constitutional monomer of an acrylic copolymer.

TABLE 3

| | ENERGY-RAY CURING ACRYL COPOLYMER | | | | | | | URETHNANE | OTHERS | |
|---|---|---|---|---|---|---|---|---|---|---|
| | ACRYL COPOLYMER (A1) | | | | | UNSATURATED COMPOUND | | ACRYLATE | C.L. | P.I. |
| | BA | ACMO | MMA | AA | HEA | MOI | | UA | CL | PI |
| WORKING EXAMPLE 15 | 65 | 7 | 0 | 0 | 28 | 10 | (90.0) | 30 | 0.625 | 3.3 |
| WORKING EXAMPLE 16 | 65 | 7 | 0 | 0 | 28 | 10 | (90.0) | 60 | 0.625 | 3.3 |
| WORKING EXAMPLE 17 | 70 | 13 | 0 | 0 | 17 | 6 | (83.0) | 30 | 0.625 | 3.3 |
| WORKING EXAMPLE 18 | 70 | 13 | 0 | 0 | 17 | 6 | (83.0) | 60 | 0.625 | 3.3 |
| WORKING EXAMPLE 19 | 52 | 20 | 0 | 0 | 28 | 8 | (71.3) | 30 | 0.625 | 3.3 |
| WORKING EXAMPLE 20 | 52 | 20 | 0 | 0 | 28 | 8 | (71.3) | 60 | 0.625 | 3.3 |
| COMPARATIVE EXAMPLE 8 | 70 | 13 | 0 | 0 | 17 | 6 | (83.0) | 0 | 0.625 | 3.3 |
| | WEIGHT PART | WEIGHT PART | WEIGHT PART | WEIGHT PART | WEIGHT PART | WEIGHT PART | EQUIVALENT RATIO | WEIGHT PART | WEIGHT PART | WEIGHT PART |

(C.L.: Crosslinking Agent, P.I.: Photomerization Initiator)

TABLE 4

| | ENERGY-RAY CURING ACRYL COPOLYMER | | | | | UNSATURATED COMPOUND | | URETHNANE ACRYLATE | OTHERS | |
|---|---|---|---|---|---|---|---|---|---|---|
| | ACRYL COPOLYMER (A1) | | | | | | | | C.L | P.I. |
| | BA | AAEM | MMA | AA | HEA | MOI | | UA | CL | PI |
| WORKING EXAMPLE 21 | 65 | 7 | 0 | 0 | 28 | 10 | (90.0) | 30 | 0.625 | 3.3 |
| WORKING EXAMPLE 22 | 65 | 7 | 0 | 0 | 28 | 10 | (90.0) | 60 | 0.625 | 3.3 |
| WORKING EXAMPLE 23 | 70 | 13 | 0 | 0 | 17 | 6 | (83.0) | 30 | 0.625 | 3.3 |
| WORKING EXAMPLE 24 | 70 | 13 | 0 | 0 | 17 | 6 | (83.0) | 60 | 0.625 | 3.3 |
| WORKING EXAMPLE 25 | 52 | 20 | 0 | 0 | 28 | 8 | (71.3) | 30 | 0.625 | 3.3 |
| WORKING EXAMPLE 26 | 52 | 20 | 0 | 0 | 28 | 8 | (71.3) | 60 | 0.625 | 3.3 |
| COMPARATIVE EXAMPLE 9 | 70 | 13 | 0 | 0 | 17 | 6 | (83.0) | 0 | 0.625 | 3.3 |
| | WEIGHT PART | WEIGHT PART | WEIGHT PART | WEIGHT PART | WEIGHT PART | WEIGHT PART | EQUIVALENT RATIO | WEIGHT PART | WEIGHT PART | WEIGHT PART |

(C.L.: Crosslinking Agent, P.I.: Photomerization Initiator)

In the energy-ray curable adhesives of working examples 21 to 26 and comparative example 9 represented in Table 4, the 2-aceto-acetoxyethyl methacrylate (AAEM) that is one of the (meth)acrylates having an aceto-acetoxyl group, was used instead of DMAA, PEA and ACMO. The adhesive sheets including the energy-ray curable adhesive layers in Table 4 were obtained by the same method as that which produced the adhesive sheets of working examples 1 to 20 and comparative examples 1 to 8 (see Tables 1 to 3), other than the differences among formulations as represented in Table 4.

Next, the evaluation test results for the adhesive sheets and the energy-ray curable adhesive layers of working examples and comparative examples are explained. Table 5 represents the evaluation test results for the energy-ray curable adhesive for forming the energy-ray curable adhesive layers, and the adhesive sheets of working examples and comparative examples.

TABLE 5

| | COMPATIBILITY | | VISCOELASTICITY | | ADHESION STRENGTH | | HOLDING POWER | FOLLOW-ABILITY TO CIRCUIT | WATER PENE-TRATION | RESIDUAL ADHESIVE | KERF SHIFT |
|---|---|---|---|---|---|---|---|---|---|---|---|
| | | | G' | | NON-CURED | CURED | | | | | |
| | VISUAL | HAZE | MPa | tan δ | mN/25 mm | mN/25 mm | | | | | μm |
| W.E. 1 | ○ | 8.2 | 0.0591 | 0.621 | 9000 | 50 | ○ | YES | NO | NO | ○(5.6) |
| W.E. 2 | ◉ | 1.6 | 0.0980 | 0.590 | 7900 | 85 | ○ | YES | NO | NO | ○(4.2) |
| W.E. 3 | ◉ | 1.8 | 0.090 | 0.610 | 8000 | 80 | ○ | YES | NO | NO | ○(7.1) |
| W.E. 4 | ◉ | 2.0 | 0.082 | 0.652 | 10000 | 65 | ○ | YES | NO | NO | ○(8.7) |
| W.E. 5 | ◉ | 3.3 | 0.0574 | 0.670 | 13000 | 55 | ○ | YES | NO | NO | ○(6.9) |
| W.E. 6 | ◉ | 4.0 | 0.0556 | 0.693 | 15000 | 50 | ○ | YES | NO | NO | ○(3.6) |
| W.E. 7 | ◉ | 4.5 | 0.0511 | 0.720 | 15500 | 50 | ○ | YES | NO | NO | ○(8.3) |
| W.E. 8 | ◉ | 2.1 | 0.0600 | 0.521 | 15300 | 50 | ○ | YES | NO | NO | ○(5.2) |
| W.E. 9 | ○ | 0.7 | 0.068 | 0.610 | 9000 | 60 | ○ | YES | NO | NO | ○(5.0) |
| W.E. 10 | ◉ | 1.9 | 0.070 | 0.768 | 11000 | 75 | ○ | YES | NO | NO | ○(4.7) |
| W.E. 11 | ◉ | 0.7 | 0.070 | 0.620 | 9000 | 60 | ○ | YES | NO | NO | ○(8.0) |
| W.E. 12 | ◉ | 3.0 | 0.065 | 0.702 | 12000 | 70 | ○ | YES | NO | NO | ○(9.1) |
| W.E. 13 | ◉ | 4.5 | 0.051 | 0.610 | 8000 | 50 | ○ | YES | NO | NO | ○(7.9) |
| W.E. 14 | ◉ | 2.1 | 0.060 | 0.631 | 9000 | 50 | ○ | YES | NO | NO | ○(7.2) |
| W.E. 15 | ○ | 8.2 | 0.081 | 0.620 | 9000 | 50 | ○ | YES | NO | NO | ○(3.0) |

TABLE 5-continued

| | COMPATIBILITY | | VISCOELASTICITY | | ADHESION STRENGTH | | HOLDING POWER | FOLLOW-ABILITY TO CIRCUIT | WATER PENE-TRATION | RESIDUAL ADHESIVE | KERF SHIFT μm |
| | VISUAL | HAZE | G' MPa | tan δ | NON-CURED mN/25 mm | CURED mN/25 mm | | | | | |
|---|---|---|---|---|---|---|---|---|---|---|---|
| W.E. 16 | ◉ | 1.6 | 0.070 | 0.775 | 10000 | 85 | ○ | YES | NO | NO | ○(6.4) |
| W.E. 17 | ◉ | 1.2 | 0.098 | 0.632 | 8000 | 80 | ○ | YES | NO | NO | ○(3.0) |
| W.E. 18 | ◉ | 3.0 | 0.080 | 0.754 | 10000 | 70 | ○ | YES | NO | NO | ○(8.3) |
| W.E. 19 | ◉ | 4.5 | 0.511 | 0.720 | 15500 | 50 | ○ | YES | NO | NO | ○(4.2) |
| W.E. 20 | ◉ | 2.1 | 0.600 | 0.521 | 15300 | 50 | ○ | YES | NO | NO | ○(6.2) |
| W.E. 21 | ○ | 1.0 | 0.090 | 0.600 | 7600 | 190 | ○ | YES | NO | NO | ○(2.0) |
| W.E. 22 | ◉ | 5.2 | 0.070 | 0.750 | 10000 | 230 | ○ | YES | NO | NO | ○(5.4) |
| W.E. 23 | ◉ | 3.5 | 0.090 | 0.523 | 8000 | 180 | ○ | YES | NO | NO | ○(3.2) |
| W.E. 24 | ◉ | 6.4 | 0.082 | 0.700 | 10000 | 200 | ○ | YES | NO | NO | ○(6.2) |
| W.E. 25 | ◉ | 5.1 | 0.080 | 0.500 | 8100 | 200 | ○ | YES | NO | NO | ○(2.2) |
| W.E. 26 | ◉ | 7.0 | 0.060 | 0.630 | 11000 | 210 | ○ | YES | NO | NO | ○(7.2) |
| C.E. 1 | — | 1.4 | 0.114 | 0.451 | 5000 | 90 | ○ | NO | YES | NO | ○(4.2) |
| C.E. 2 | — | 1.4 | 0.137 | 0.556 | 7100 | 80 | ○ | NO | YES | NO | ○(4.1) |
| C.E. 3 | X | 12.2 | 0.075 | 0.600 | 7100 | 90 | ○ | YES | NO | YES | ○(7.1) |
| C.E. 4 | X | 9.2 | 0.080 | 0.701 | 10500 | 500 | X | YES | NO | NO | X(15.1) |
| C.E. 5 | X | 7.2 | 0.100 | 0.571 | 8700 | 1560 | X | NO | YES | NO | X(12.3) |
| C.E. 6 | X | 5.0 | 0.141 | 0.421 | 7400 | 3525 | ○ | NO | YES | YES | ○(6.3) |
| C.E. 7 | — | 0.4 | 0.097 | 0.352 | 8500 | 85 | ○ | NO | YES | NO | ○(3.2) |
| C.E. 8 | — | 0.4 | 0.141 | 0.478 | 7100 | 80 | ○ | NO | YES | NO | ○(2.2) |
| C.E. 9 | — | 0.5 | 0.141 | 0.478 | 6100 | 80 | ○ | NO | YES | NO | ○(3.2) |

Haze: Adhesive sheets were obtained for evaluating the haze of the energy-ray curable adhesives of the working and comparative examples. These adhesive sheets used in the evaluation tests were formed by the same method as that explained above, except for using a polyester film (thickness: 100 μm, COSMO SHINE A4100, trade name of a product of TOYOBO CO., LTD) as a substrate.

The release films were removed from the adhesive sheets in the evaluation testing process, and the hazes of these sheets were evaluated visually and haze values were measured based on JIS K7105.

Visual: The appearances of the adhesive sheets were observed visually.
  ◉: No indication of separation or turbidity (nebula) at all
  ○: Slight indication of turbidity
  x: Strong indication of turbidity or separation Storage modulus G' and tan δ: Adhesive sheets of working and comparative examples were obtained by the same production method as explained previously, with the difference being the use of two release sheets for protecting the exposed surfaces. These adhesive sheets include only the energy-ray curable adhesives, with the substrate having been omitted. These adhesive sheets were piled so that the energy-ray curable adhesive layer had a thickness of approximately 4 mm and dies having a cylindrical-shape with an 8 mm diameter were cut from the piled adhesive sheets, in order to evaluate viscoelasticity.

The storage modulus G' at 25 degrees Celsius and values of tan δ of these test materials were measured by a viscoelasticity measuring device (DYNAMIC ANALYZER RDA II manufactured by REOMETRIC SCIENTIFIC F.E. LTD.).

The adhesion strength: The adhesion strength of the adhesive sheets of the working and comparative examples were measured by a versatile tensile tester (TENSILON/UTM-4-100 manufactured by ORIENTEC Co., Ltd.) by the same method as JIS Z0237, with the only difference being that the adhered-to surface was a mirror surface of a silicone wafer. The results of the tests are represented as adhesion strength in a non-cured state.

Further, the adhesive sheets, which had been laminated to mirror surfaces of a silicone wafers, were held for 20 minutes under conditions of 50 percent RH humidity at 23 degrees Celsius before an ultraviolet ray energy-ray was irradiated to the substrate side of the adhesive sheets (radiation condition: illuminance 350 mW/cm$^2$, amount of radiation 200 mJ/cm$^2$), by an ultraviolet ray radiation device (RAD-2000 manufactured by LINTEC Corporation). The adhesion strength of the adhesive sheets to which the ultraviolet rays had been irradiated, was measured by the same method as that explained above, as the adhesion strength in a cured state.

Holding power (Cohesion): The adhesive sheets were trimmed down to the size of 25 mm×100 mm. Then, a 25 mm×25 mm interior area of the adhesive sheets was attached to a stainless steel plate. The sheets were then pressed onto the stainless steel plate by passing a 2 kg weight roller back and forth, five times. The pressed adhesive sheets were held for 20 minutes under conditions of 50 percent RH humidity at 23 degrees Celsius, and then held for an additional 15 minutes in a creep tester at 40 degrees Celsius. Then, a creep was carried out under a 1 kg load applied in the shear direction, in accordance to JIS 20237. The adhesive sheets which did not fully creep down from the stainless steel plate are evaluated as "◯", and the adhesive sheets which did fully creep down are evaluated as "x".

Followability to circuit: Dummy wafers were prepared with circuit patterns having the maximum height difference of 20 μm on a silicone wafer (diameter: 200 mm, thickness: 750 μm). These dummy wafers were half-cut diced on the circuit surface, with 2 mm×2 mm pitch, kerf width of 40 μm, and kerf depth of 130 μm, by a dicing device (DFD6361 manufactured by DISCO CORPORATION). The adhesive sheets of the working and comparative examples were laminated to the circuit surfaces of the half-diced dummy wafers by a tape laminator (RAD-3500 F/12 manufactured by LINTEC Corporation). The circuit pattern surfaces of the dummy wafers were observed through the substrate of the adhesive sheet through a microscope (digital microscope VHX-200 manufactured by KEYENCE CORPORATION) at 2000 magnification. When air (a bubble) was not detected between the adhesive sheet and the circuit pattern surface around the uneven circuit patterns in the observation area, an evaluation was made that the adhesive sheet had maintained followability with respect to the circuit. On the other hand, when air (a bubble) was detected, an evaluation was made that the adhesive sheet had not maintained followability with respect to the circuit.

Water penetration and residual adhesive: After followability was evaluated, the backside surface of the dummy wafers were ground down to the thickness of 100 μm by a wafer backside surface grinding device (DGP8760 manufactured by DISCO CORPORATION), so that the dummy wafers could be divided into chips. Then, an ultraviolet ray as an energy-ray was irradiated to the chips (radiation condition: illuminance 350 mW/cm$^2$, light quantity 200 mJ/cm$^2$) by the ultraviolet ray radiation device (RAD-2000 manufactured by LINTEC Corporation), and the adhesive was removed from the chips by a tape mounter with a tape removing device (RAD-2700 F/12 manufactured by LINTEC Corporation). The exposed circuit patterns were then observed through a microscope (digital microscope VHX-200 manufactured by KEYENCE CORPORATION) at 2000 magnification. Based on observation results, an evaluation was made as to whether or not water penetration resulted in contamination of the wafer surface, and whether or not the residual adhesive was detected.

Kerf shift: The divided chips were observed through a microscope (digital microscope VHX-200 manufactured by KEYENCE CORPORATION) to evaluate the amount of the kerf shift. The kerf shift was evaluated on the basis of the shift amount of the four chips located at the center of the dummy wafer, as exemplified in FIG. 1. First, the shift amount of side $A_1$, as represented by the shift amount $G_1$ in FIG. 1(a) was measured. Side $A_1$ is the side of the first chip CA that is the closest of its four sides to the center point P of the dummy wafer. The shift amount $G_1$ is the distance between side $A_1$ of chip CA and side $B_1$ being one of four sides of the second chip CB. The second Chip CB is adjacent to the first chip CA, and the position of side $B_1$ of the second chip CB corresponds to the position of side $A_1$ of the first Chip CA in that they are both oriented in the same direction.

Further, the shift amount $G_2$ representing the shift amount of side $A_2$ of the first chip CA was measured similarly to the shift amount $G_1$. The shift amount $G_2$ is the distance between side $A_2$ of the first chip CA and side $C_2$ of the third chip CC. Side $A_2$ shares a corner with side $A_1$ and is close to the center point P. The third chip CC is adjacent to the first chip CA, and the position of side $C_2$ of the third chip CC corresponds to the position of side $A_2$ of the first chip CA.

Further, as represented in FIG. 1(b) to (d), the shift amounts $G_3$ to $G_8$ for the second to fourth chips CB, CC, and CD, were also measured similarly to the shift amounts $G_1$ and $G_2$. Note that if the all of the shift amounts $G_1$ to $G_8$ in FIG. 1 were totaled up, the same kerf shift would be double-counted (for example the shift amounts $G_1$ in FIG. 1(a) and the shift amount $G_4$ in FIG. 1(b)). Therefore, half the amount of the collective total shift amounts $G_1$ to $G_8$ represented in FIG. 1 was determined to be the final resulting total kerf shift amount (μm) (see Table 1). Further, based on the calculated total kerf shift amount (μm), the kerf shift was evaluated as follows.

◯: The total kerf shift amount was not more than 11 μm, and the first to fourth chips CA, CB, CC, and CD did not make contact with each other.

x: The total kerf shift amount was greater than 11 μm, and/or some of the first to fourth chips CA, CB, CC, and CD did make contact with each other.

As explained above, in this embodiment either a dialkyl (meth)acrylamide, a phenol EO modified (meth)acrylate, a (meth)acryloyl morpholine, or a (meth)acrylate having an aceto-acetoxyl group, all of which are high polar monomers that have no negative impact on polymerization, is used as a constitutional monomer of the energy-ray curable acrylic copolymer. As a result, the energy-ray curable acrylic copolymer has sufficient compatibility to the high polar urethane acrylate. By using this combination of energy-ray curable acrylic copolymer and urethane acrylate, an adhesive sheet that has sufficient followability to bond to the uneven circuit surface of a wafer and so on, and sufficient adhesion strength, that can prevent the penetration of water for grinding onto the circuit surface of a wafer during grinding processes, that can prevent a kerf shift, and that can prevent residual adhesive matter, is realized.

The materials of members constituting the adhesive sheet are not limited to those exemplified in the embodiment. Especially to the constitutional monomer of the energy-ray curable acrylic copolymer, a dialkyl(meth)acrylamide, a phenol EO modified (meth)acrylate, a (meth)acryloyl morpholine, and a (meth)acrylate having an aceto-acetoxyl group, all of which are able to be copolymerized with one another, therefore, mixture of more than two of those monomers can be used as constitutional monomers of the energy-ray curable acrylic copolymer. Further, the adhesive sheet can be used for various purposes, that is, the adhesive sheet can be used not only for protecting a semiconductor wafer under the grinding step of the DBG process, but also for protecting a semiconductor wafer under a conventional process and for protecting the surface of parts other than semiconductor wafers.

This invention is not limited to that described in the preferred embodiment, namely, various improvements and changes may be made to the present invention without departing from the spirit and scope thereof.

The present disclosure relates to subject matter contained in Japanese Patent Applications No. 2006-105012 (filed on Apr. 6, 2006), No. 2007-049575 (filed on Feb. 28, 2007), No. 2007-049711 (filed on Feb. 28, 2007), No. 2007-049739 (filed on Feb. 28, 2007), and No. 2007-049282 (filed on Feb. 28, 2007) which are expressly incorporated herein, by reference, in its entirety.

What is claimed is:

1. An adhesive sheet comprising:
a substrate; and
an energy-ray curable adhesive layer formed on said substrate,
said energy-ray curable adhesive layer comprising a mixture of an energy-ray curable urethane acrylate and an energy-ray curable acrylic copolymer, said energy-ray curable adhesive layer having higher adhesion strength prior to curing with an energy-ray than after curing with the energy ray,
said energy-ray curable acrylic copolymer being a copolymer of at least a (meth)acryloyl morpholine in total of 1 to 30 weight percent of all monomers used to form said energy-ray curable acrylic copolymer, and said energy-ray curable acrylic copolymer comprising a side chain comprising an unsaturated group; and
the storage modulus of said energy-ray curable adhesive layer is between 0.04 MPa and 0.11 MPa, and the value of tan δ at 25 degrees Celsius is greater than or equal to 0.6, when said energy-ray curable adhesive layer is not cured by energy-ray.

2. The adhesive sheet according to claim 1, wherein said energy-ray curable acrylic copolymer is formed by a reaction of
an acrylic copolymer comprising a functional monomer that has a functional group, and a (meth)acryloyl morpholine as monomers; and
an unsaturated compound comprising a substitution group reactive to said functional group of said functional monomer;
wherein 20 to 100 equivalents of said substitution group are reacted to 100 equivalents of said functional group.

3. The adhesive sheet according to claim 1, wherein said energy-ray curable adhesive layer is formed by 1 to 200 weight parts of said energy-ray curable urethane acrylate compounding with 100 weight parts of said energy-ray curable acrylic copolymer.

4. An adhesive sheet comprising:
a substrate; and
an energy-ray curable adhesive layer formed on said substrate,
said energy-ray curable adhesive layer comprising a mixture of an energy-ray curable urethane acrylate and an energy-ray curable acrylic copolymer, said energy-ray curable adhesive layer having higher adhesion strength prior to curing with an energy-ray than after curing with the energy ray,
said energy-ray curable acrylic copolymer being a copolymer of at least a (meth)acryloyl morpholine in total of 1 to 30 weight percent of all monomers used to form said energy-ray curable acrylic copolymer, and said energy-ray curable acrylic copolymer comprising a side chain comprising an unsaturated group; and
the adhesion strength of said adhesive sheet that is not cured by energy-ray, is more than or equal to 7000 mN/25 mm; and the adhesion strength of said adhesive sheet that is cured by energy-ray, is not more than 500 mN/25 mm.

5. The adhesive sheet according to claim 2, wherein said functional group is selected from a group consisting of a hydroxyl group, a carboxyl group, an amino group, a substituted amino group, and a epoxy group.

6. The adhesive sheet according to claim 5, wherein said functional group is a hydroxyl group.

7. The adhesive sheet according to claim 2, wherein said acrylic copolymer further comprises a main monomer selected from a group consisting of (meth) acrylic acid ester monomer, and a constitutional unit of the derivatives thereof.

8. The adhesive sheet according to claim 1, wherein said energy-ray curable urethane acrylate comprises a (meth)acryloyl group.

9. The adhesive sheet according to claim 8, wherein said (meth)acryloyl group is located at the terminal of said energy-ray curable urethane acrylate.

10. A method for producing a semiconductor chip, comprising:
adhering an adhesive sheet to a front side surface of a semiconductor wafer upon which a groove is formed, said adhesive sheet comprising a substrate and an energy-ray curable adhesive layer provided on said substrate, said energy-ray curable adhesive layer comprising a mixture of an energy-ray curable urethane acrylate and an energy-ray curable acrylic copolymer, said energy-ray curable acrylic copolymer being a copolymer of at least a (meth)acryloyl morpholine in total of 1 to 30 weight percent of all monomers used to form said energy-ray curable acrylic copolymer, and said energy-ray curable acrylic copolymer comprising a side chain comprising an unsaturated group, said energy-ray curable adhesive layer having higher adhesion strength prior to curing with an energy-ray than after curing with the energy ray, and the storage modulus of said energy-ray curable adhesive layer is between 0.04 MPa and 0.11 MPa, and the value of tan δ at 25 degrees Celsius is greater than or equal to 0.6, when said energy-ray curable adhesive layer is not cured by energy-ray; and
grinding a backside surface of said semiconductor wafer whose front side surface adheres to said adhesive sheet and thus dividing said semiconductor wafer into a plurality of said semiconductor chips.

11. The method according to claim 10, further comprising curing the energy-ray curable adhesive with an energy-ray to thereby decrease the adhesion strength of the adhesive layer.

12. The method according to claim 11, further comprising, subsequent to the curing, removing the adhesive sheet.

13. The method according to claim 10, wherein said energy-ray curable acrylic copolymer is formed by a reaction of
an acrylic copolymer comprising a functional monomer that has a functional group, and a (meth)acryloyl morpholine as monomers; and
an unsaturated compound comprising a substitution group reactive to said functional group of said functional monomer;
wherein 20 to 100 equivalents of said substitution group are reacted to 100 equivalents of said functional group.

14. The method according to claim 10, wherein said energy-ray curable adhesive layer is formed by 1 to 200 weight parts of said energy-ray curable urethane acrylate compounding with 100 weight parts of said energy-ray curable acrylic copolymer.

15. A method for producing a semiconductor chip, comprising:
adhering an adhesive sheet to a front side surface of a semiconductor wafer upon which a groove is formed, said adhesive sheet comprising a substrate and an energy-ray curable adhesive layer provided on said substrate, said energy-ray curable adhesive layer comprising a mixture of an energy-ray curable urethane acrylate and an energy-ray curable acrylic copolymer, said energy-ray curable acrylic copolymer being a copolymer of at least a (meth)acryloyl morpholine in total of 1 to 30 weight percent of all monomers used to form said energy-ray curable acrylic copolymer, and said energy-ray curable acrylic copolymer comprising a side chain comprising an unsaturated group, said energy-ray curable adhesive layer having higher adhesion strength of more than or equal to 7000 mN/25 mm prior to curing with an energy-ray than after curing with the energy ray of not more than 500 mN/25 mm; and grinding a backside surface of said semiconductor wafer whose front side surface adheres to said adhesive sheet and thus dividing said semiconductor wafer into a plurality of said semiconductor chips.

16. The method according to claim 13, wherein said functional group is selected from a group consisting of a hydroxyl group, a carboxyl group, an amino group, a substituted amino group, and a epoxy group.

17. The method according to claim 10, wherein said energy-ray curable urethane acrylate comprises a (meth)acryloyl group.

18. The method according to claim 17, wherein said (meth)acryloyl group is located at the terminal of said energy-ray curable urethane acrylate.

* * * * *